(12) United States Patent
Dabby et al.

(10) Patent No.: US 10,327,331 B2
(45) Date of Patent: Jun. 18, 2019

(54) STRETCHABLE COMPUTING DEVICE

(71) Applicant: Intel Corporation, Santa Clara, CA (US)

(72) Inventors: Nadine L. Dabby, Palo Alto, CA (US); Adel A. Elsherbini, Chandler, AZ (US); Braxton Lathrop, Lake Oswego, OR (US); Sasha N. Oster, Chandler, AZ (US); Aleksandar Aleksov, Chandler, AZ (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 15/762,811

(22) PCT Filed: Sep. 25, 2015

(86) PCT No.: PCT/US2015/052429
§ 371 (c)(1),
(2) Date: Mar. 23, 2018

(87) PCT Pub. No.: WO2017/052634
PCT Pub. Date: Mar. 30, 2017

(65) Prior Publication Data
US 2018/0255635 A1    Sep. 6, 2018

(51) Int. Cl.
*H05K 1/02* (2006.01)
*G06F 1/16* (2006.01)
*H05K 1/11* (2006.01)

(52) U.S. Cl.
CPC ........... *H05K 1/0283* (2013.01); *G06F 1/163* (2013.01); *G06F 1/1656* (2013.01); *H05K 1/118* (2013.01); *H05K 2201/0133* (2013.01)

(58) Field of Classification Search
USPC .................................................. 361/749, 748
See application file for complete search history.

(56) References Cited

U.S. PATENT DOCUMENTS

2004/0192082 A1    9/2004  Wagner et al.
2012/0051005 A1*   3/2012  Vanfleteren ........... H01L 21/565
                                                    361/749

(Continued)

FOREIGN PATENT DOCUMENTS

DE      112015006948 T5    7/2018
WO      WO-2017052634 A1   3/2017

OTHER PUBLICATIONS

"International Application Serial No. PCT/US2015/052429, International Search Report dated Jul. 11, 2016", 5 pgs.

(Continued)

*Primary Examiner* — Andargie M Aychillhum
(74) *Attorney, Agent, or Firm* — Schwegman Lundberg & Woessner, P.A.

(57) ABSTRACT

Some forms relate to a stretchable computing device. The stretchable computing device includes a first layer that includes electrical interconnects at a first density wherein the first layer includes a first electronic component; a stretchable second layer electrically connected to the first layer, wherein the stretchable second layer includes electrical interconnects at a second density that is less than the first density, wherein the second layer includes a second electronic component; and a stretchable third layer electrically connected to the stretchable second layer, wherein the stretchable third layer includes electrical interconnects at a third density that is less than the second density.

9 Claims, 3 Drawing Sheets

(56) References Cited

U.S. PATENT DOCUMENTS

2012/0052268 A1* 3/2012 Axisa ................ H01L 23/49838
428/212
2013/0133822 A1* 5/2013 Koetse ................... H05K 3/303
156/247
2014/0104793 A1   4/2014 Park et al.

OTHER PUBLICATIONS

"International Application Serial No. PCT/US2015/052429, Written Opinion dated Jul. 11, 2016", 10 pgs.

* cited by examiner

STRETCHABLE COMPUTING DEVICE

CROSS-REFERENCE TO RELATED APPLICATION

This application is a U.S. National Stage Filing under 35 U.S.C. 371 from International Application No. PCT/US2015/052429, filed on Sep. 25, 2015, and published as WO 2017/052634, which application is incorporated herein by reference in its entirety.

TECHNICAL FIELD

Embodiments described herein generally relate to a computing device, and more particularly to a stretchable computing device.

BACKGROUND

Conventional wearable applications typically use stand-alone rigid devices (e.g., smart watches or glasses), or rigid bulky packs that snap into a connector on a garment or belt. Other types of applications use flexible/conformable patches in which a battery and sensors are integrated into one patch that is then adhesively bonded to the skin. As examples, healthcare and fitness applications may utilize such computing devices.

One class of wearable computing devices that is rising in importance relates to textiles which include integrated electronic devices. More recent applications try to create "smart" garments that seamlessly integrate electronics into a garment that is able to be washed multiple times (e.g., by a washing machine).

Therefore, a need exists for wearable (and stretchable) computing devices that may integrate various sensors, power supplies and electronic packages directly into a textile. Stretchable computing devices may enable various approaches to managing different types of applications (e.g., wearable applications) where computing power may be utilized to enhance the application.

DESCRIPTION OF EMBODIMENTS

Figure 1:
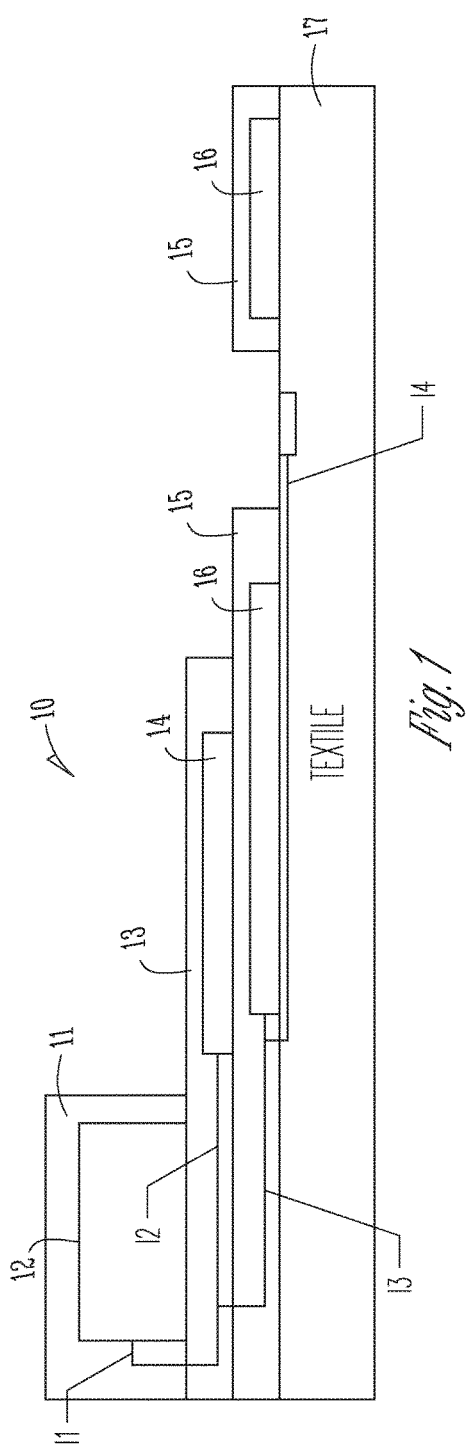
FIG. 1 is a schematic side view illustrating an example stretchable computing device.

The following description and the drawings sufficiently illustrate specific embodiments to enable those skilled in the art to practice them. Other embodiments may incorporate structural, logical, electrical, process, and other changes. Portions and features of some embodiments may be included in, or substituted for, those of other embodiments. Embodiments set forth in the claims encompass all available equivalents of those claims.

Orientation terminology, such as "horizontal," as used in this application is defined with respect to a plane parallel to the conventional plane or surface of a wafer or substrate, regardless of the orientation of the wafer or substrate. The term "vertical" refers to a direction perpendicular to the horizontal as defined above. Prepositions, such as "on," "side" (as in "sidewall"), "higher," "lower," "over," and "under" are defined with respect to the conventional plane or surface being on the top surface of the wafer or substrate, regardless of the orientation of the wafer or substrate.

The example stretchable computing devices described herein may be integrated with (or attached to) textiles (e.g., clothing). In other forms, the example wearable computing devices may be attached directly to the skin of someone (i.e., similar to a bandage) that utilizes any of the example stretchable computing devices. The stretchable computing devices described herein may be placed on or near a variety of locations on a human body.

The example wearable computing devices described herein may include a variety of electronics. Some examples include a power supply and/or a communication device among other types of electronics.

As used herein "stretchable" refers to the ability elongate in the direction of an applied force. The amount of stretching will be determined in part based on the application where any of the example stretchable computing devices described herein are to be used. As an example, the degree of stretching may be different when the example stretchable computing devices described herein are integrated with (or detachably connected to) textiles (e.g., clothing) as opposed when the example stretchable computing devices described herein are attached directly to the skin of someone that utilizes any of the example stretchable computing devices.

GENERAL

The stretchable computing devices described herein include a first layer that includes electrical interconnects at a first density. A second layer is electrically connected to the first layer. The second layer includes electrical interconnects at a second density that is different than the first density. At least one (or both) of the first layer and the second layer includes an integrated circuit and at least one (or both) of the first layer and the second layer is stretchable.

The stretchable computing devices described herein may serve to address the complexity associated with integrating various electronic components that require different amounts of input/output (I/O) and different signal fidelities. As examples, a sensor may need fewer signals to go to a processor, while the processor itself acts as a hub for all of the I/O, data processing and assorted commands that need to be delivered via several high fidelity traces.

The stretchable computing devices may be an improvement over known techniques that either (i) utilize either a rigid or flexible printed circuit board that is connected to a textile via snap conductors or conductive thread; and/or (ii) include fully encapsulated circuitry embedded in an elastomeric substrate with some kind of wireless connectivity to an external computing device.

The electronic stretchable computing devices described herein would allow for bridging of low to high density interconnects. This bridging of low to high density interconnects may be especially useful for incorporation into smart textiles.

FIG. 1 is a schematic side view illustrating an example stretchable computing device 10. The stretchable computing device 10 includes a first layer 11 that includes electrical interconnects at a first density I1 (see FIG. 3). The first layer 11 includes a first electronic component 12.

The stretchable computing device 10 further includes a stretchable second layer 13 that is electrically connected to the first layer 11. The stretchable second layer 13 includes electrical interconnects at a second density I2 (see FIG. 3) that is less than the first density I1. The stretchable second layer 13 includes a second electronic component 14.

The stretchable computing device 10 further includes a stretchable third layer 15 that is electrically connected to the stretchable second layer 13. The stretchable third layer 15 includes electrical interconnects at a third density I3 (see FIG. 3) that is less than the second density I2.

In some forms, the first electronic component 12 is an electronic package. As an example, the first layer 11 may include an electronic system such that the electronic package is part of the electronic system.

In some forms, the second electronic component 14 is a sensor that exchanges signals with the first electronic component 12. It should be noted that the first electronic component 12 and the second electronic component 14 may be any type of electronic component that is known now, or discovered in the future. The types of first and second electronic components 12, 14 that are included in the stretchable computing device 10 will depend in part on the application where the stretchable computing device 10 is to be utilized.

Figure 3:
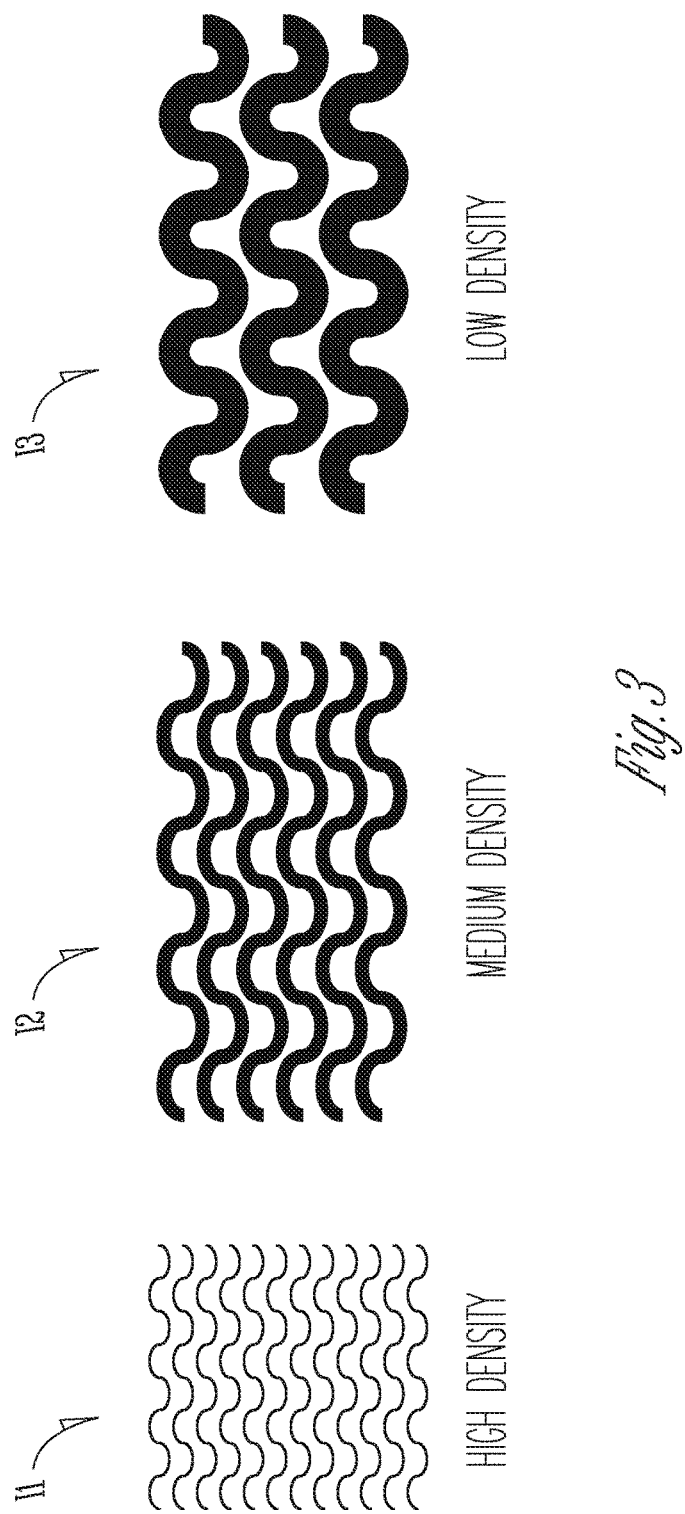
FIG. 3 is a schematic view illustrating comparative examples of different densities of electrical interconnects.

As shown in FIG. 3, the electrical interconnects in the first layer may be meandering traces and the electrical interconnects in the second stretchable layer may be meandering traces. In addition the electrical interconnects in the third stretchable layer 15 may be meandering traces. One, some or all of the meandering traces in the first, second and third layers 11, 13, 15 may have a modified sinusoidal shape.

It should be noted that the electrical interconnects in the first, second and third layers 11, 13, 15 may have any shape that is known now, or discovered in the future. The type of electrical interconnects that are included in the stretchable computing device 10 will depend in part on the application where the stretchable computing device 10 is to be used as well as the manufacturing processes that are associated with fabricating the stretchable computing device 10.

As shown in FIG. 1, the stretchable computing device 10 may further include a textile layer 17 that is electrically connected to the stretchable third layer 15. In some forms, the textile layer 17 may include electrical interconnects at a fourth density that is less than the third density I3. The type of textile layer 17 that is included in the stretchable computing device 10 will depend in part on the application where the stretchable computing device 10 is to be utilized as well as the type of textile layer 17. As an example, the textile layer 17 may be part of a fabric that forms a garment (among many other types of applications).

The various densities I1, I2, I3 may be particularly suited for the electronic components embedded within the first, second and third layers 11, 13, 15. As examples, a high density interconnect would be connected to a system-in-package 12 in the first layer 11 and a medium density interconnect 12 may be connected to a sensor 14 in the stretchable second layer 13. In addition, a lower density interconnect 13 might be used to connect the medium density interconnect to the textile layer 17.

Figure 2:
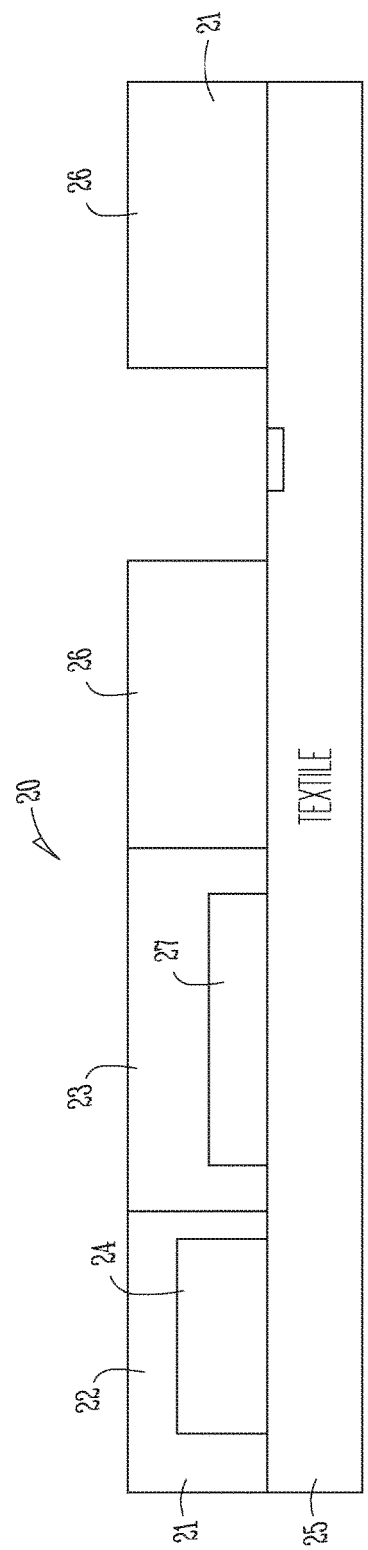
FIG. 2 is a schematic side view illustrating another example stretchable computing device.

FIG. 2 is a schematic side view illustrating an example stretchable computing device 20. The stretchable computing device 20 includes a first layer 21 that includes a first portion 22 with electrical interconnects at a first density I1 (see FIG. 3). The first layer further includes a second portion 23 with electrical interconnects at a second density I2 (see FIG. 3) that is less than the first density I1. The first portion 22 includes a first electronic component 24.

The stretchable computing device 20 further includes a stretchable second layer 25 that is electrically connected to the first layer 21. The stretchable second layer 25 includes electrical interconnects at a third density I3 (see FIG. 3) that is less than the first density I1 and the second density I2.

In some forms, the first layer 21 includes a third portion 26 with electrical interconnects at a fourth density that is less than the first density I1 and the second density I2 but greater than the third density I3. The relative densities of the electrical interconnects within the stretchable computing device 20 will depend in part on the locations and types of electronic components that are included in the stretchable computing device 20.

In some forms, the first electronic component 24 includes an electronic package that is electrically connected to the electrical interconnects in the first portion 22. In addition, the second portion 23 of the first layer 21 may include a sensor 27 that is electrically connected to the electrical interconnects in the second portion 23.

It should be noted that the first and second portions 22, 23 of the first layer 21 may (i) not be stretchable; (ii) both be stretchable; or (iii) have one of the first and second portions 22, 23 be stretchable.

As shown in FIG. 2, the stretchable second layer 25 may be a textile layer. It should be noted that the textile may be any type of textile that is known now, or discovered in the future. The type of textile that is included in the stretchable computing device 20 will depend on the application where the stretchable computing device 20 is to be utilized as well as the manufacturing processes that are associated with fabricating the stretchable computing device 20 (among other factors).

The stretchable computing device 20 may serve to facilitate the laying out and connection of circuits that have varying complexity within a textile. Each portion of the textile may have different electrical interconnection requirements in terms of density depending on where various electronic components are located on the textile. In addition, the stretchable computing device 20 may permit for incorporation of different portions that may each have different stretchable properties.

The manufacturing processes that are utilized to fabricate the stretchable computing devices 10, 20 may be any manufacturing process that are known now, or discovered in the future. As examples, the stretchable computing devices 10, 20 may be manufactured using 3-D printing of conductive material, wire bonding and screen printing conductive ink (among many other types of processes).

Figure 4:
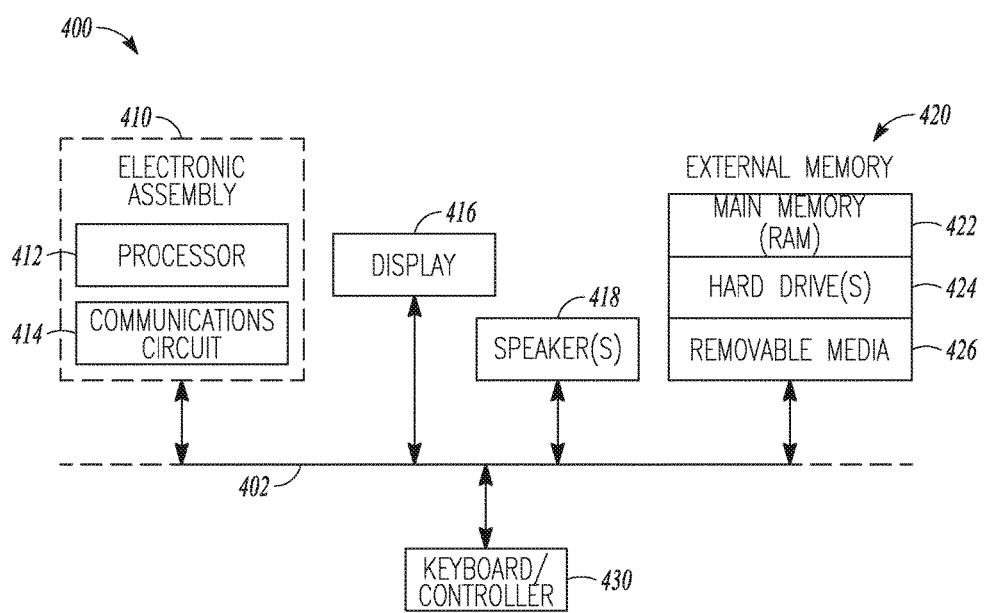
FIG. 4 is block diagram of an electronic apparatus that includes the electronic assemblies and/or the electronic packages described herein.

FIG. 4 is a block diagram of an electronic apparatus 400 incorporating at least one stretchable computing device 10, 20 described herein. Electronic apparatus 400 is merely one example of an electronic apparatus in which forms of the stretchable computing devices 10, 20 described herein may be used. Examples of an electronic apparatus 400 include, but are not limited to, personal computers, tablet computers, mobile telephones, game devices, MP3 or other digital media players, etc. In this example, electronic apparatus 400 comprises a data processing system that includes a system bus 402 to couple the various components of the electronic apparatus 400. System bus 402 provides communications links among the various components of the electronic apparatus 400 and may be implemented as a single bus, as a combination of busses, or in any other suitable manner.

An electronic apparatus 400 as describe herein may be coupled to system bus 402. The electronic apparatus 400 may include any circuit or combination of circuits. In one embodiment, the electronic apparatus 400 includes a processor 412 which can be of any type. As used herein, "processor" means any type of computational circuit, such as but not limited to a microprocessor, a microcontroller, a complex instruction set computing (CISC) microprocessor, a reduced instruction set computing (RISC) microprocessor, a very long instruction word (VLIW) microprocessor, a graphics processor, a digital signal processor (DSP), multiple core processor, or any other type of processor or processing circuit.

Other types of circuits that may be included in electronic apparatus 400 are a custom circuit, an application-specific integrated circuit (ASIC), or the like, such as, for example, one or more circuits (such as a communications circuit 414) for use in wireless devices like mobile telephones, tablet computers, laptop computers, two-way radios, and similar electronic systems. The IC can perform any other type of function.

The electronic apparatus 400 may also include an external memory 420, which in turn may include one or more memory elements suitable to the particular application, such as a main memory 422 in the form of random access memory (RAM), one or more hard drives 424, and/or one or more drives that handle removable media 426 such as compact disks (CD), flash memory cards, digital video disk (DVD), and the like.

The electronic apparatus 400 may also include a display device 416, one or more speakers 418, and a keyboard and/or controller 430, which can include a mouse, trackball, touch pad, voice-recognition device, or any other device that permits a system user to input information into and receive information from the electronic apparatus 400.

To better illustrate the stretchable computing devices disclosed herein, a non-limiting list of examples is provided herein:

Example 1 includes stretchable computing device. The stretchable computing device includes a first layer that includes electrical interconnects at a first density; a second layer electrically connected to the first layer, wherein the second layer includes electrical interconnects at a second density that is different than the first density, wherein at least one of the first layer and the second layer includes an integrated circuit; and wherein at least one of the first layer and the second layer is stretchable.

Example 2 includes the stretchable computing device of example 1, wherein the first layer is stretchable and the second layer is stretchable.

Example 3 includes the stretchable computing device of any one of examples 1 to 2, wherein the electrical interconnects include traces.

Example 4 includes the stretchable computing device of any one of examples 1 to 3, wherein the traces are meandering traces.

Example 5 includes the stretchable computing device of any one of examples 1 to 4, wherein the meandering traces have a sinusoidal shape.

Example 6 includes the stretchable computing device of any one of examples 1 to 5, wherein the integrated circuit is a die.

Example 7 includes the stretchable computing device of any one of examples 1 to 6, wherein the first layer and second layer each include an integrated circuit.

Example 8 includes a stretchable computing device. The stretchable computing device includes a first layer that includes electrical interconnects at a first density wherein the first layer includes a first electronic component; a stretchable second layer electrically connected to the first layer, wherein the stretchable second layer includes electrical interconnects at a second density that is less than the first density, wherein the second layer includes a second electronic component; and a stretchable third layer electrically connected to the stretchable second layer, wherein the stretchable third layer includes electrical interconnects at a third density that is less than the second density.

Example 9 includes the stretchable computing device of example 8, wherein the first electronic component is an electronic package.

Example 10 includes the stretchable computing device of any one of examples 8 to 9, wherein the first layer includes an electronic system such that the electronic package is part of the electronic system.

Example 11 includes the stretchable computing device of any one of examples 8 to 10, wherein the second electronic component is a sensor that exchanges signals with the first electronic component.

Example 12 includes the stretchable computing device of any one of examples 8 to 11, wherein the electrical interconnects in the first layer are meandering traces, wherein the electrical interconnects in the second stretchable layer are meandering traces, and wherein the electrical interconnects in the third stretchable layer are meandering traces.

Example 13 includes the stretchable computing device of any one of examples 7 to 12, wherein the first transmission line and the second transmission line are orthogonal to one another where the first transmission line and the second transmission line cross each other.

Example 14 includes the stretchable computing device of any one of examples 7 to 13, and further including a textile layer electrically connected to the stretchable third layer.

Example 15 includes the stretchable computing device of any one of examples 7 to 14, wherein the textile layer includes electrical interconnects at a fourth density that is less than the third density.

Example 16 includes the stretchable computing device of any one of examples 7 to 15, wherein the textile layer is formed of a fabric.

Example 17 includes a stretchable computing device. The stretchable computing device includes a first layer that includes a first portion with electrical interconnects at a first density and a second portion with electrical interconnects at a second density that is less than the first density, wherein the first portion includes a first electronic component; and a stretchable second layer electrically connected to the first layer, wherein the stretchable second layer includes electrical interconnects at a third density that is less than the first density and the second density.

Example 18 includes the stretchable computing device of example 17, wherein first layer includes a third portion with electrical interconnects at a fourth density that is less than the first density and the second density but greater than the third density.

Example 19 includes the stretchable computing device of any one of examples 17 to 18, wherein the first electronic component includes an electronic package that is electrically connected to the electrical interconnects in the first portion, and wherein the second portion of the first layer includes a sensor that is electrically connected to the electrical interconnects in the second portion.

Example 20 includes the stretchable computing device of any one of examples 17 to 19, wherein the stretchable second layer is a textile layer, and wherein the first portion of the first layer is not stretchable and the second portion of the first layer is stretchable.

The above detailed description includes references to the accompanying drawings, which form a part of the detailed description. The drawings show, by way of illustration, specific embodiments in which the invention can be practiced. These embodiments are also referred to herein as "examples." Such examples can include elements in addition to those shown or described. However, the present inventors also contemplate examples in which only those elements shown or described are provided. Moreover, the present inventors also contemplate examples using any combination or permutation of those elements shown or described (or one or more aspects thereof), either with respect to a particular example (or one or more aspects thereof), or with respect to other examples (or one or more aspects thereof) shown or described herein.

In this document, the terms "a" or "an" are used, as is common in patent documents, to include one or more than one, independent of any other instances or usages of "at least one" or "one or more." In this document, the term "or" is used to refer to a nonexclusive or, such that "A or B" includes "A but not B," "B but not A," and "A and B," unless otherwise indicated. In this document, the terms "including" and "in which" are used as the plain-English equivalents of the respective terms "comprising" and "wherein." Also, in the following claims, the terms "including" and "comprising" are open-ended, that is, a system, device, article, composition, formulation, or process that includes elements in addition to those listed after such a term in a claim are still deemed to fall within the scope of that claim. Moreover, in the following claims, the terms "first," "second," and "third," etc. are used merely as labels, and are not intended to impose numerical requirements on their objects.

The above description is intended to be illustrative, and not restrictive. For example, the above-described examples (or one or more aspects thereof) may be used in combination with each other. Other embodiments can be used, such as by one of ordinary skill in the art upon reviewing the above description.

Also, in the above Detailed Description, various features may be grouped together to streamline the disclosure. This should not be interpreted as intending that an unclaimed disclosed feature is essential to any claim. Rather, inventive subject matter may lie in less than all features of a particular disclosed embodiment. Thus, the following claims are hereby incorporated into the Detailed Description, with each claim standing on its own as a separate embodiment, and it is contemplated that such embodiments can be combined with each other in various combinations or permutations. The scope of the invention should be determined with reference to the appended claims, along with the full scope of equivalents to which such claims are entitled.

The invention claimed is:

1. A stretchable computing device, comprising:
   a first layer that includes first electrical interconnects within the first layer, the first electrical interconnects being at a first density wherein the first layer includes a first electronic component that is electrically connected to the electrical first electrical interconnects;
   a stretchable second layer that includes second electrical interconnects within the second layer, the second electrical interconnects being at a second density that is less than the first density, wherein the second layer includes a second electronic component that is electrically connected to the electrical second electrical interconnects, the second electrical interconnects being electrically connected to the first electrical connects; and
   a stretchable third layer such that the second stretchable layer is between the first layer and the third layer, wherein the stretchable third layer includes third electrical interconnects within the third later, the third electrical interconnects being at a third density that is less than the second density, the third electrical interconnects being electrically connected to the second electrical connects.

2. The stretchable computing device of claim 1, wherein the first electronic component is an electronic package.

3. The stretchable computing device of claim 2, wherein the first layer includes an electronic system such that the electronic package is part of the electronic system.

4. The stretchable computing device of claim 2, wherein the second electronic component is a sensor that exchanges signals with the first electronic component.

5. The stretchable computing device of claim 1, wherein the first electrical interconnects in the first layer are meandering traces, wherein the second electrical interconnects in the second stretchable layer are meandering traces, and wherein the third electrical interconnects in the third stretchable layer are meandering traces.

6. The stretchable computing device of claim 5, wherein the meandering traces in the first layer have a sinusoidal shape, wherein the meandering traces in the second stretchable layer have a sinusoidal shape, and wherein the meandering traces in the third stretchable layer have a sinusoidal shape.

7. The stretchable computing device of claim 1, further comprising a textile layer electrically connected to the stretchable third layer.

8. The stretchable computing device of claim 7, wherein the textile layer includes fourth electrical interconnects at a fourth density that is less than the third density.

9. The stretchable computing device of claim 7, wherein the textile layer is formed of a fabric.

* * * * *